United States Patent
Heilbronner et al.

(10) Patent No.: US 7,227,259 B2
(45) Date of Patent: Jun. 5, 2007

(54) LOW-INDUCTANCE CIRCUIT ARRANGEMENT FOR POWER SEMICONDUCTOR MODULES

(75) Inventors: Heinrich Heilbronner, Stein (DE); Thomas Stockmeier, Nuremberg (DE)

(73) Assignee: Semikron Elektronik GmbH & Co. KG, Nuremberg (DE)

( * ) Notice: Subject to any disclaimer, the term of this patent is extended or adjusted under 35 U.S.C. 154(b) by 499 days.

(21) Appl. No.: 10/643,391

(22) Filed: Aug. 18, 2003

(65) Prior Publication Data

US 2005/0024805 A1 Feb. 3, 2005

(30) Foreign Application Priority Data

Aug. 16, 2002 (DE) .................... 102 37 561

(51) Int. Cl.
*H01L 23/34* (2006.01)
(52) U.S. Cl. .................... 257/724; 257/E25.016; 257/723; 257/685; 363/141; 363/132; 361/806
(58) Field of Classification Search .......... 257/E23.14, 257/723–725, 747, 713, E25.016, E23.044, 257/685; 363/141, 132, 144; 361/806, 820
See application file for complete search history.

(56) References Cited

U.S. PATENT DOCUMENTS

| | | | | |
|---|---|---|---|---|
| 4,458,305 A | * | 7/1984 | Buckle et al. | 363/141 |
| 4,816,984 A | * | 3/1989 | Porst et al. | 363/56.02 |
| 5,459,356 A | * | 10/1995 | Schulze et al. | 257/773 |
| 5,585,672 A | * | 12/1996 | Koike et al. | 257/707 |
| 5,929,519 A | * | 7/1999 | Mori et al. | 257/724 |
| 5,956,231 A | * | 9/1999 | Yamada et al. | 361/728 |
| 6,381,161 B2 | * | 4/2002 | Mourick | 363/147 |
| 6,525,950 B1 | * | 2/2003 | Shirakawa et al. | 363/144 |
| 6,566,750 B1 | * | 5/2003 | Sofue et al. | 257/723 |
| 6,664,629 B2 | * | 12/2003 | Maeno | 257/723 |
| 6,793,502 B2 | * | 9/2004 | Parkhill et al. | 439/66 |
| 6,906,404 B2 | * | 6/2005 | Maly et al. | 257/678 |
| 6,987,670 B2 | * | 1/2006 | Ahmed et al. | 361/699 |

FOREIGN PATENT DOCUMENTS

DE 19618978 A1 5/1996
DE 19752408 A1 11/1997

OTHER PUBLICATIONS

Germain Examination Report for DE 102 37 561.5-33 of Mar. 18, 2003 (2-pages).
German Decision to Grant for DE 102 37 561.5-33, PA12 2002 DE of Mar. 28, 2003 (1-page).

* cited by examiner

*Primary Examiner*—Kenneth Parker
*Assistant Examiner*—Chris C. Chu
(74) *Attorney, Agent, or Firm*—Lackenbach Siegel, LLP; Andrew F. Young (57) ABSTRACT

A circuit arrangement for a power semiconductor module provides low parasitic inductances and low loss. An electrically insulating substrate supports metallic ribbon connectors which in turn power attached semiconductor components. DC port conducts are positioned in close proximity to each other and are arranged in at least one partial sector parallel and in close proximity to the surface of the substrate and/or the ribbon connectors and electrically insulated from the same, and at least one AC port conductor is similarly attached. The port conductors include surface elements enabling simplified low-inductance wire bond connection from the port conductors to either the power semiconductor components or ribbon connectors or both.

28 Claims, 5 Drawing Sheets

LOW-INDUCTANCE CIRCUIT ARRANGEMENT FOR POWER SEMICONDUCTOR MODULES

CROSS-REFERENCE TO RELATED APPLICATIONS

This application claims priority from DE 102 37 561.5, filed Aug. 16, 2002, the contents of which are incorporated fully herein by reference.

SELECTED FIGURE FOR PUBLICATION

Figure 4:
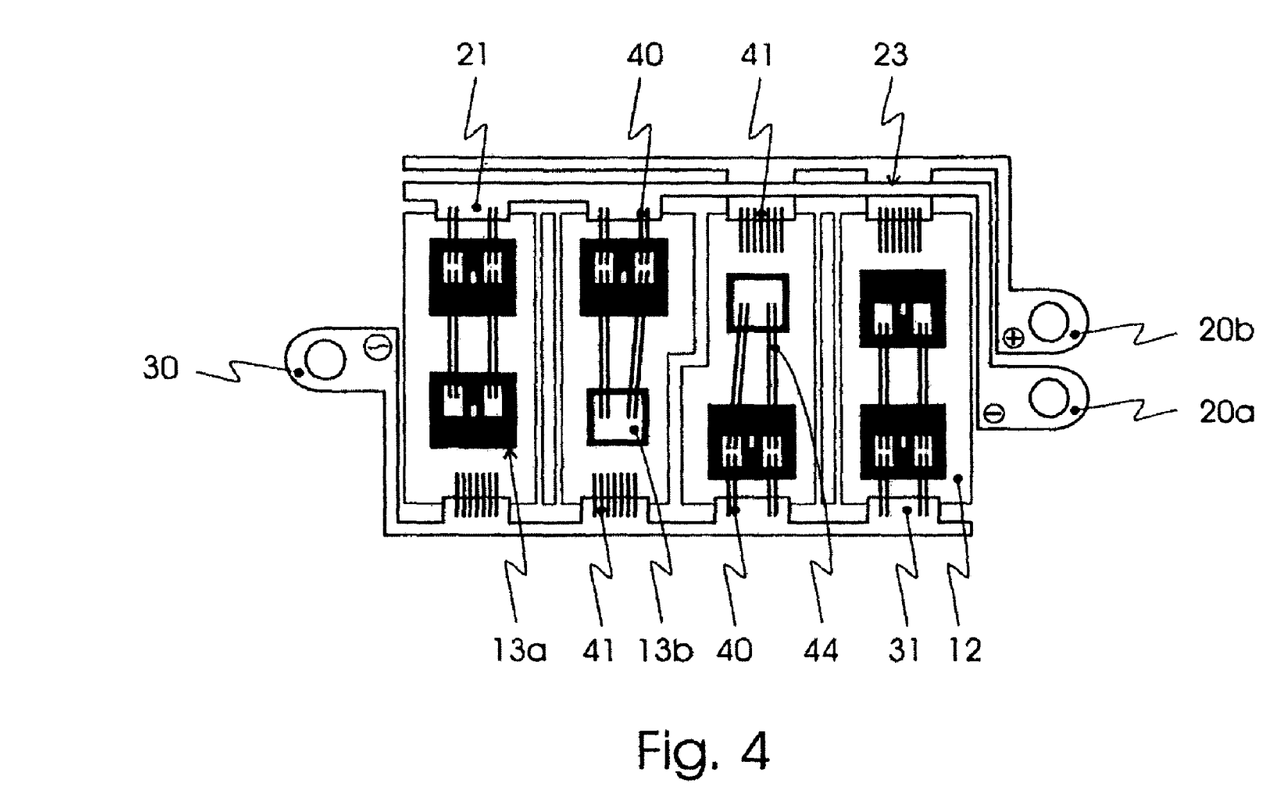
FIG. 4 is a schematic top view of an inventive circuit arrangement according to an alternative construction of the present invention.

FIG. 4 is selected for publication purposes.

BACKGROUND OF THE INVENTION

1. Field of the Invention

The present invention relates to a low-inductance circuit arrangement for power semiconductor modules. More specifically, the present invention relates to a low-inductance circuit arrangement for high-speed modem power semiconductor modules having low parasitic inductances and low ohmic resistance.

2. Description of the Related Art

Power transistors such as IGBTs (Insulating-Gate Bipolar Transistors) or MOSFETs (Metal Oxide Semiconductor Field-Effect Transistors) are conventionally known. In use, power transistors such as IGBTs and MOSFETs are regulated, i.e., switched into a conductive or non-conductive state, by applying a certain voltage between the gate and the emitter.

It is conventionally known that individual switches and power semiconductor modules may have individual constructive means to reduce parasitic inductances, certain designs are shown in, for example, EP 0 277 546, DE 39 37 045 or DE 100 37 533.

EP 0 277 546 describes a method for reducing parasitic inductances in the DC input leads of an individual switch. Here, the two DC input leads are arranged in close proximity and at least partially parallel to each other. This results in a small current-circumfused (current surrounded) surface in the area of the closely adjacent input lead arrangement and thus a lower inductance of this input lead sector. Here, the DC input leads are connected to the substrate in a positive bond by means of soldering. Similarly, DE 196 18 978 A1 discloses a comparable arrangement for the load ports, unfortunately, the entire arrangement including the substrate is not of sufficiently low inductance, since the current-circumfused (current surrounded) surfaces (see description in DE 100 37 533 C1) are too large.

DE 39 37 045 describes a method of reducing parasitic inductances in the DC input leads of a half-bridge. As shown, the two DC input leads are arranged contiguously, but with the AC input lead between the plus and minus lead, and at least partially parallel to each other. This arrangement also has the effect of reducing the size of the current-circumfused surface in the area if the adjacent arrangement of input leads and thus a relatively low inductance of this input lead sector. Here, the DC and AC leads are also connected to the substrate in a positive bond by means of soldering.

DE 100 37 533 describes a circuit arrangement with very low parasitic inductances. The description arranges the individual power transistors of the two power switches in series and in an attempt to provide finger-like contact elements between the individual power transistors. Unfortunately, the low parasitic inductances in this circuit arrangements, achieved with this pressure-contacted arrangement, are still limited.

DE 197 52 408 A1 discloses contiguously arranged port conductors some of which are attached to or arranged in a frame-like housing. Unfortunately, these port conductors are auxiliary port conductors which, in contrast to the load port conductors consisting of DC and AC port conductors, have no effect on the parasitic inductances of the power semiconductor module.

Compact power semiconductor modules are conventionally described in DE 197 19 703. This type of power semiconductor module consists of ceramic substrates with applied ribbon (or web or track-type) connectors on which semiconductor components are arranged. These semiconductor components are connected by soldering to the ribbon connectors, and they have bonded connections with other semiconductor components. The port elements on the housing wall are provided with partial surfaces from where wire bond connections are established with individual ribbon connectors of the substrate.

Unfortunately, in EP 0 277 546, while the transistors forming the individual switch are in close proximity to each other, the current can nevertheless flow through the circuit arrangement along dissimilar paths, in particular along paths of dissimilar length. This design results in dissimilar current-circumfused surfaces, dissimilar inductances for the different conduction paths, and also dissimilar ohmic resistance values for these conduction paths. As a particular detriment to this design, the design of a half-bridge with such individual switches can never be of low inductance due to the external circuitry necessary for that purpose. Consequently, considering all characteristics together, this design leads to a certain reduction in parasitic inductances of the overall system of intermediate circuit and DC/AC converter. Unfortunately, the design shown does not meet all the requirements for minimizing parasitic inductances. Neither can an arrangement of individual switches, each with its own housing, meet the requirements of a compact and/or cost-effective design of the overall system.

Similarly to the above discussion, DE 39 37 045 misses the goal of low parasitic inductance for two main reasons. First, the DC port conductors are not arranged at a minimal distance from each other, since the AC port conductor is arranged between the two DC port conductors. Consequently, the current-circumfused surface in the area of the DC port conductors is not minimal, and thus the inductances for this area are not minimal either. Secondly, the power transistors of the first and second power switches are relative far apart, which also increases the parasitic inductances. In this arrangement, the relatively large surfaces parallel to the substrate below the port conductors for the plus and AC port are contrary to the goal of compact assemblies.

In sum, the unfortunate consequence of the above-mentioned related art teachings are circuit designs having ineffective low-inductance design and result in substantially larger parasitic inductances than necessary.

OBJECTS AND SUMMARY OF THE INVENTION

An object of the present invention is to provide a low-inductance circuit arrangement for power semiconductor modules.

It is another object of the present invention to provide a low-inductance circuit arrangement for modem power semiconductor modules using high-speed, low-loss semiconductor switches.

It is another object of the present invention to provide a low-inductance circuit arrangement for use in a wide variety of electrical devices and modules having a compact size and design and reasonable and reduced manufacturing cost.

It is another object of the present invention to provide an electronic device containing a circuit arrangement with a unique design having low parasitic inductances.

It is another object of the present invention to provide a circuit arrangement suited for the design of rectifier arrangements in which preferably power diodes and/or power thyristors are used.

It is another object of the present invention to provide a circuit arrangement in which (1) the entire arrangement has low parasitic inductances, (2) the input and output current leads to the semiconductor components are of reduced ohmic inductance, and (3) in which the semiconductor components and the port conductors require only a small total surface, whereby the port conductors (alternatively connecting conductors, hook-up conductors, terminal conductors etc.) only slightly reduce the substrate surface available for the required semiconductor components.

The present invention relates to a circuit arrangement for a power semiconductor module provides low parasitic inductances and low loss. An electrically insulating substrate supports metallic ribbon connectors which in turn power attached semiconductor components. DC port conducts are positioned in close proximity to each other and are arranged in at least one partial sector parallel and in close proximity to the surface of the substrate and/or the ribbon connectors and electrically insulated from the same, and at least one AC port conductor is similarly attached. The port conductors include surface elements enabling simplified low-inductance wire bond connection from the port conductors to either the power semiconductor components or ribbon connectors or both.

According to an embodiment of the present invention there is provided a circuit arrangement, for power semiconductor modules, comprising: at least one electrically insulating substrate, at least two mutually insulated ribbon connectors on the substrate, at least one power semiconductor component attached to at least one of the ribbon connectors, at least a first and a second DC port conductors and at least one AC port conductor, the DC port conductors being arranged proximate to each other and at least one of the substrate and the ribbon conductors, each DC port conductor including at least a first substantial length portion in parallel to a second respective substantial length portion on the second DC port conductor, the AC port conductor having at least one portion proximate at least one of the substrate surface and the ribbon connectors, at least one surface element extending at least at a first angle from each of the AC port conductor and at least one of the DC port conductors, and at least one electrical connection extending from the at least one surface element to at least one of the power semiconductor component and the at least one ribbon conductor, whereby the circuit arrangement provides a low parasitic inductance and a low ohmic resistance in a power semiconductor module.

According to an embodiment of the present invention there is provided a circuit arrangement, for power semiconductor modules, wherein: the first angle is a ninety degree angle, whereby the at least one surface element extends substantially parallel to the substrate.

According to an embodiment of the present invention there is provided a circuit arrangement, for power semiconductor modules, wherein: the first angle is at least one of an acute angle and an obtuse angle between the at least one surface element on each of the AC port conductor and the at least one DC port conductor, and a top surface of the substrate, whereby the surface element avoids close contact with at least one of the ribbon conductor and the at least one power semiconductor component.

According to an embodiment of the present invention there is provided a circuit arrangement, for power semiconductor modules, wherein: each DC port conductor is arranged proximate the ribbon conductors, the DC port conductors and the at least one surface element being electrically insulated from the ribbon conductors, whereby no direct electrical link exists between the DC port conductors and the ribbon conductor, the AC port conductors are arranged proximate the ribbon conductor, and the AC port conductors being electrically insulated from the ribbon conductors, whereby no direct electrical link exists between the AC port conductors and the ribbon conductor.

According to an embodiment of the present invention there is provided a circuit arrangement, for power semiconductor modules, further comprising: projecting end portions on each respective the DC and AC port conductors extending away from the substrate, and each respective projecting portion including at least one respective contact element for securing external electrical contacting of the power semiconductor module to the port conductor.

According to an embodiment of the present invention there is provided a circuit arrangement, for power semiconductor modules, further comprising: a housing bounding the power semiconductor module and the circuit, the housing enclosing the at least one substrate and mechanically supporting respective the DC and AC port conductors, the housing including at least two spaced apart recesses, and the projecting end portions extending through the spaced apart recesses enabling simple electrical connection thereto while the housing provides electrical protection to the circuit.

According to an embodiment of the present invention there is provided a circuit arrangement, for power semiconductor modules, wherein: the at least one electrical connection is a wire bond connection, whereby the wire bond connection and the at least one surface element enable simple electrical connection during an assembly of the circuit while maintaining low parasitic induction of the circuit.

According to an embodiment of the present invention there is provided a circuit arrangement, for power semiconductor modules, further comprising: at least one sensor component on at least one of the substrate and the at least one ribbon connector.

According to an embodiment of the present invention there is provided a circuit arrangement, for power semiconductor modules, further comprising: at least one recess defined in at least one of the DC and the AC port conductors, and the at least one recess is on a side of the at least one port conductor facing the at least one substrate, whereby a base of the recess is further from the at substrate than a bottom surface of the at least one port conductor.

According to an embodiment of the present invention there is provided a circuit arrangement, for power semiconductor modules, further comprising: at least one electrical insulation layer, and the at least one insulation layer extending between at least a portion of one of the DC port conductor and the at least one ribbon connector.

According to an embodiment of the present invention there is provided a circuit arrangement, for power semiconductor modules, further comprising: an extension layer of the electrical insulating layer extending between the at least one surface element and one of the ribbon connector and the substrate.

According to an embodiment of the present invention there is provided a circuit arrangement, for power semiconductor modules, further comprising: at least one base element extending from a bottom surface of at least one of the DC and the AC port conductors, and the at least one base element supporting the at least one port conductor on the at least one substrate.

According to an embodiment of the present invention there is provided a circuit arrangement, for power semiconductor modules, further comprising: at least one metal lamination on the substrate opposite on an opposite side of the substrate from the at least one ribbon connector.

According to an embodiment of the present invention there is provided a circuit arrangement, for power semiconductor modules, further comprising: at least one electrical insulation layer, the at least one insulation layer extending between at least a portion of one of the DC port conductor and the at least one ribbon connector, an extension layer of the electrical insulating layer extending between the at least one surface element and one of the ribbon connector and the substrate, at least one base element extending from a bottom surface of at least one of the DC and the AC port conductors, and the at least one base element supporting the at least one port conductor on the at least one substrate.

According to an embodiment of the present invention there is provided a circuit arrangement, for power semiconductor modules, comprising: at least one electrically insulating substrate, at least two mutually insulated ribbon connectors on the substrate, at least one power semiconductor component attached to at least one of the ribbon connectors, at least a first and a second DC port conductors and at least one AC port conductor, the DC port conductors being arranged proximate to each other and at least one of the substrate and the ribbon conductors, each DC port conductor including at least a first substantial length portion in parallel to a second respective substantial length portion on the second DC port conductor, the AC port conductor having at least one portion proximate at least one of the substrate surface and the ribbon connectors, at least one surface element extending at least at a first angle from each of the AC port conductor and at least one of the DC port conductors, at least one electrical connection extending from the at least one surface element to at least one of the power semiconductor component and the at least one ribbon connector, at least one electrical insulation layer, and the at least one insulation layer extending between at least a portion of one of the DC port conductor and the at least one ribbon connector, whereby the circuit arrangement provides a low parasitic inductance and a low ohmic resistance in a power semiconductor module.

According to an embodiment of the present invention there is provided a circuit arrangement, for power semiconductor modules, further comprising: an extension layer of the electrical insulating layer extending between the at least one surface element and one of the ribbon connector and the substrate.

According to an embodiment of the present invention there is provided a circuit arrangement, further comprising: at least one base element extending from a bottom surface of at least one of the DC and the AC port conductors, and the at least one base element supporting the at least one port conductor on the at least one substrate.

According to another embodiment of the present invention, there is provided an electrical device, comprising: a power semiconductor module, the power semiconductor module including a circuit arrangement comprising: at least one electrically insulating substrate, at least two mutually insulated ribbon connectors on the substrate, at least one power semiconductor component attached to at least one of the ribbon connectors, at least a first and a second DC port conductors and at least one AC port conductor, the DC port conductors being arranged proximate to each other and at least one of the substrate and the ribbon conductors, each DC port conductor including at least a first substantial length portion in parallel to a second respective substantial length portion on the second DC port conductor, the AC port conductor having at least one portion proximate at least one of the substrate surface and the ribbon connectors, at least one surface element extending at least at a first angle from each of the AC port conductor and at least one of the DC port conductors, at least one electrical connection extending from the at least one surface element to at least one of the power semiconductor component and the at least one ribbon conductor, at least one electrical insulation layer, and the at least one insulation layer extending between at least a portion of one of the DC port conductor and the at least one ribbon connector, whereby the circuit arrangement provides a low parasitic inductance and a low ohmic resistance in a power semiconductor module.

According to another embodiment of the present invention, there is provided a circuit arrangement, further comprising: an extension layer of the electrical insulating layer extending between the at least one surface element and one of the ribbon connector and the substrate.

According to another embodiment of the present invention, there is provided a circuit arrangement, further comprising: at least one base element extending from a bottom surface of at least one of the DC and the AC port conductors, and the at least one base element supporting the at least one port conductor on the at least one substrate.

According to another embodiment of the present invention, there is provided a circuit arrangement, with low inductances and low ohmic resistance in the current inputs and outputs in a power semiconductor modules, comprising: at least one electrically insulating substrate, a plurality of mutually insulated metallic ribbon connectors applied to the substrate, at least one power semiconductor component attached to at least one of respective the ribbon connectors, at least a first and a second DC port conductors and at least one AC port conductor, the DC port conductors being arranged proximate to each other and at least one of the substrate and the ribbon conductors, each DC port conductor including at least a substantial length portion in parallel to a second respective substantial length portion on the second DC port conductor, at least one AC port conductor having at least one portion in close proximity to one of the substrate surface and the ribbon connectors, at least one of the DC port conductors and the AC port conductor include at least one surface element, the at least one surface element extending substantially parallel to a surface of the substrate, and at least one electrical connection extending from the at least one surface element to at least one of the power semiconductor component and the at least one ribbon conductor, whereby the circuit arrangement provides a low parasitic inductance in a power semiconductor module.

According to another embodiment of the present invention, there is provided a circuit arrangement, wherein: the DC port conductors are arranged proximate the ribbon conductors, the DC port conductors being electrically insulated from the ribbon conductors, whereby no direct electrical link exists between the DC port conductors and the ribbon conductor, the AC port conductors are arranged proximate the ribbon conductor, and the AC port conductors being electrically insulated from the ribbon conductors, whereby no direct electrical link exists between the AC port conductors and the ribbon conductor.

According to another embodiment of the present invention, there is provided a circuit arrangement, wherein: the power semiconductor module is provided with a housing that encloses the at least one substrate and supports respective the DC and AC port conductors mechanically, the housing including at least two spaced apart recesses, extending portions of respective the DC and AC port conductors extending through the recesses away from the housing, and each respective the extending portion including a respective contact element for securing external electrical contacting of the power semiconductor module.

According to another embodiment of the present invention, there is provided a circuit arrangement, wherein: the at least one electrical connection is a wire bond connection.

According to another embodiment of the present invention, there is provided a circuit arrangement, further comprising: at least one sensor component arranged on at least one of the substrate and the at least one ribbon connector.

According to another embodiment of the present invention, there is provided a circuit arrangement, wherein: at least one of the DC and the AC port conductors includes at least one recess, and the at least one recess is on a side of the at least one port conductor facing the at least one substrate.

According to another embodiment of the present invention, there is provided a circuit arrangement, further comprising: an electrical insulation layer between at least a portion of the at least one DC port conductor and the at least one ribbon connector.

According to another embodiment of the present invention, there is provided a circuit arrangement, wherein: the electrical insulating layer extends below the at least one surface element.

According to another embodiment of the present invention, there is provided a circuit arrangement, wherein: at least one base element is on at least one of the DC and the AC port conductors, whereby the at least one base element supports the at least one port conductor relative to the at least one substrate.

According to another embodiment of the present invention, there is provided a current regulated circuit arrangement including one of a MOSFET and an IGBT power transistor.

The above, and other objects, features and advantages of the present invention will become apparent from the following description read in conduction with the accompanying drawings, in which like reference numerals designate the same elements.

DETAILED DESCRIPTION OF THE PREFERRED EMBODIMENTS

The present invention relates to a low-inductance circuit arrangement for power semiconductor modules. More specifically, the present invention relates to a low-inductance circuit arrangement for modem power semiconductor modules providing and using preferred high-speed, low-loss semiconductor switches as taught herein. The present invention similarly provides a circuit with unique design having low parasitic inductances and a compact size.

According to the present invention the present design is adapted for use with MOSFETs or insulated gate bipolar transistors (IGBTs) with free-running diodes in antiparallel type connections which are especially suited as power semiconductor components for this circuit arrangement. Such circuit arrangements and exemplary power converters designed with the same must be configured with low inductance to avoid the occurrence of debilitating or damaging voltage spikes, especially during shut-down or a breaking type current.

This means that leakage type inductances in the intermediate circuit, at the port conductors (alternatively a connecting conductor, hook-up conductor, terminal-type conductor or leadless chip carrier) and on the substrate surface of the circuit arrangement must be low. Unfortunately, when the sum of leakage inductances reaches a range of about 20 nH, this can cause conventional low-voltage MOSFETs to lead to voltage spikes, that can easily destroy the power semiconductor switches. Another requirement is for the present invention is a compact design, on the one hand to allow the construction of appropriate overall systems needing little space, and on the other hand to reduce the cost of manufacturing the power semiconductor modules. Similarly, the present invention is suited for the design of rectifier arrangements in which preferably power diodes and/or power thyristors are used.

As noted earlier the present design introduces a circuit arrangement in which the entire arrangement has low parasitic inductances, in which the input and output current leads to the semiconductor components are of reduced ohmic inductance, and in which the semiconductor components and the port conductors require only a small total surface, whereby the port conductors only slightly reduce the substrate surface available for the semiconductor components.

Figure 1:
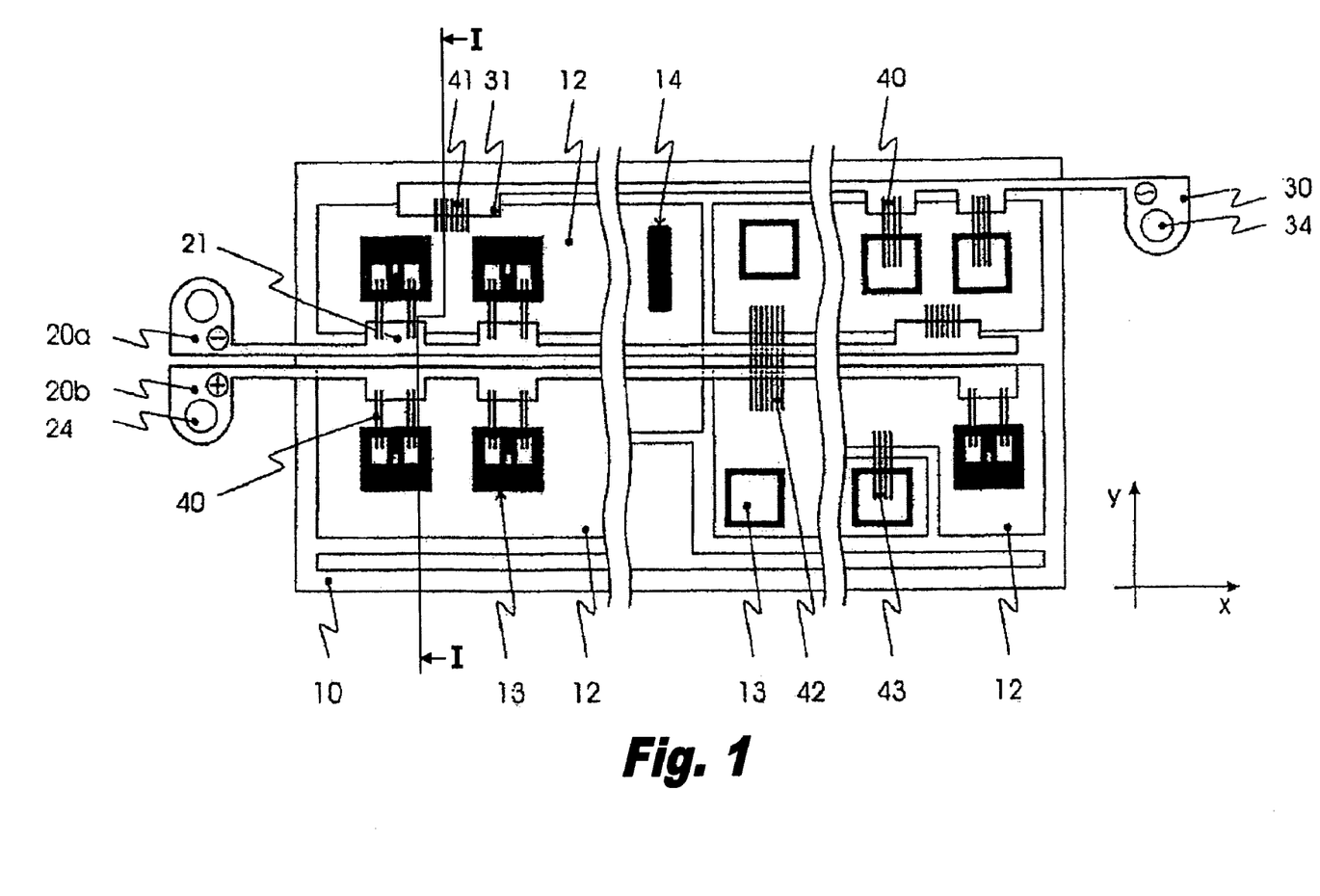
FIG. 1 is a schematic top view of an inventive circuit arrangement according to an embodiment of the present invention.

Referring now to FIG. 1, a top view of an inventive circuit arrangement demonstrates elements of the different design possibilities. The circuit arrangement consists of a substrate 10 conventionally made of an insulating ceramic, such as aluminum oxide. Multiple (or singular) metallic ribbon connectors 12 are applied to substrate 10 by means of a direct-bonding method.

These ribbon connectors 12 form individual sectors on substrate 10, and are insulated from each other (mutually insulated). Such combinations of a ceramic substrate 10 and circuit-friendly ribbon connectors 12 arranged on same are interchangeably known, for example, as DCB (direct copper bonding) substrates and are frequently used for power semiconductor modules.

A number of power semiconductor components 13 (IGBTs, MOSFETs, Thyristors etc.) are positively bonded to the DCB substrate (10, 12) by means of soldering. IGBTs (insulated gate bipolar transistors) and free-running diodes or MOSFETs in antiparallel connection with the same have proven to be successful power semiconductor components to serve as power semiconductor modules. Alternatively, thyristors can be used as well. Advantageously, other sensor components 14 such as current or temperature sensors are arranged on the DCB substrates of power semiconductor modules. The electrical connection between the power semiconductor components 13 and other ribbon connectors 12 is achieved by means of wire bond connections 43.

For electrical connection between the power semiconductor components 13 and external ports, the circuit arrangement is provided with port conductors 20, 30. Each of these is formed by a flat metal body which for external contacting is provided with contact elements respectively 24 and 34, designed as screw connections, although alternative designs may be adapted to a particular need. A housing (not shown) is provided with recesses for port conductors 20, 30 which extend outwards through recesses (also not shown) in the housing for electrical connection. Port conductors 20 include DC port conductors 20a, 20b, as shown.

It should be understood, that to achieve low parasitic inductances, the present invention places DC port conductors 20a, 20b over their entire length in mutual close proximity and separated from each other only by an insulation layer (later described as insulation foil 25 in FIG. 2) that is necessary for their electrical insulation. It is also advantageous—to achieve the lowest possible parasitic inductances—when substantial partial sectors of DC port conductors 20 (20a, 20b) are arranged in close proximity to substrate 10 and/or to the ribbon connectors 12. However, for this purpose, an electrical insulation must be arranged between the connector ribbons 12 and the port conductor 20 unless an electrical connection between them is desirable and circuit-friendly.

Port conductor 30 is an AC port conductor 30 is arranged as shown, such that the shortest possible wire bond connection is possible with the ribbon connectors 12 and/or the semiconductor components 13 assigned to the AC port conductor. This positioning is advantageous, since it allows a compact design of the overall power semiconductor module.

Port conductors 20, 30 may be provided with recesses (shown later at Reference No. 23 in FIG. 3) in whose area the port conductors 20, 30 are not in close proximity to substrate 10 or ribbon connectors 12. These recesses are shown as a removed-rectangle shape (angular C-cut out) but may be any desired shape sufficient to increase the local absolute distance between the body of the respective port conductor 20, 30 and substrate 10 or ribbon connectors 12.

As shown in FIG. 1, for example, a recess is provided on DC port conductors 20a, 20b to allow a series of wire bond connections 42 to extend between other circuit components, in this case between two ribbon connectors 12, but other components may be substituted as necessary. In other embodiments of the present invention, these recesses may be smaller or larger depending upon the number of wire bond connectors 12 required. As an example, with a single wire bond connector 12, the recess may be narrower, thus reducing the size of the completed unit.

For internal electrical contacting, i.e. contacting with power semiconductor components 13 and/or with ribbon connectors 12, the DC/AC port conductors 20, 30 are provided with a number of surface elements, respectively DC surface elements 21 and AC surface elements 31. These surface elements 21, 31 are designed projecting tabs of the respective port conductor 20,30 and are shown projecting from the main body of the port conductors 20,30 substantially parallel to the substrate, but other arrangements are possible depending upon a desired size of the final unit. For example, surface elements 21,31 may project as tab portions or members at an acute or obtuse angle to their respective port conductors 20, 30 depending upon the manufacturing needs of the unit.

On a side facing away from (opposite to) substrate 10, these tabs (surface elements 21,31) have surfaces large enough to accommodate any needed bond bases (shown but not numbered), i.e., the contacts for contacting respective wire bond connections (40,41). By means of these surface elements 21,31 and their respective wire bond connections 40, 41 extending from these, respective port conductors 20, 30 are contacted in a circuit-friendly manner, as required, with ribbon connectors 12 and/or with semiconductor components 13.

An especially advantageous benefit from this design is the direct contact via a wire bond connection 40 between the surface element 21,31 and a semiconductor component 13, since this design means that the contact requires a minimum of space and results in a compact component.

Figure 2:
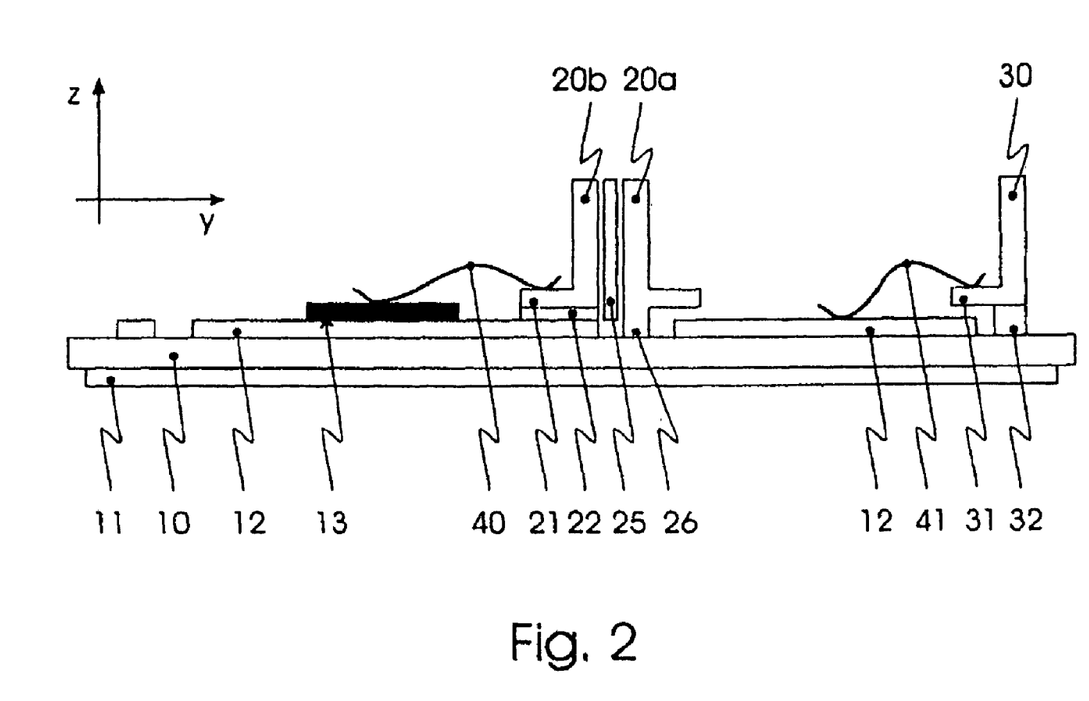
FIG. 2 is a representative cross-sectional view of an inventive circuit arrangement according to the embodiment in FIG. 1 along section line I-I.
Figure 3:
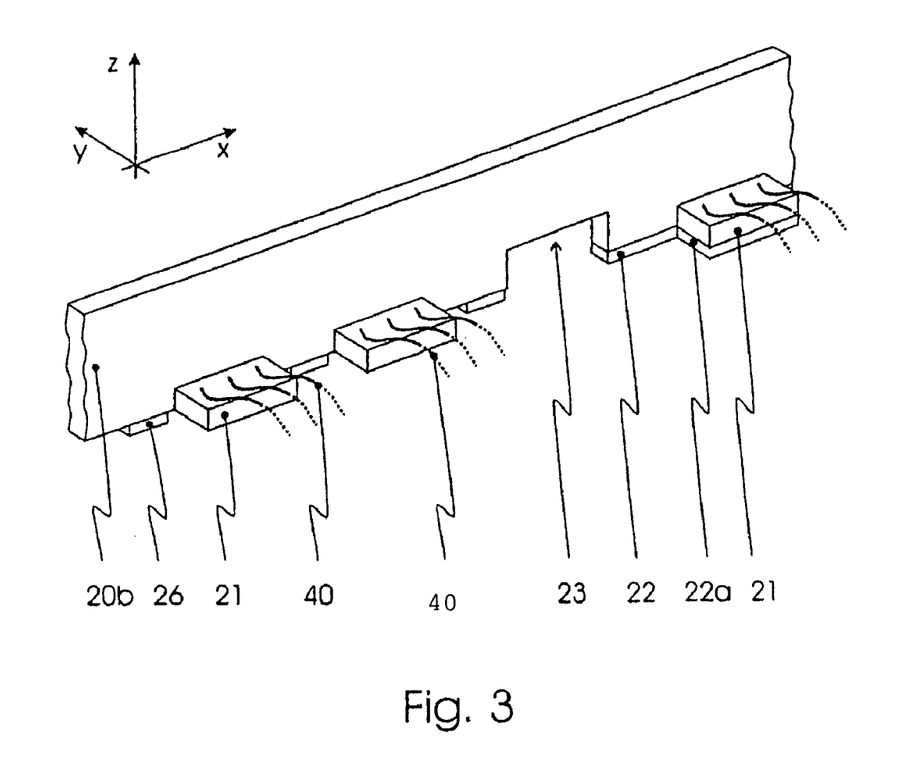
FIG. 3 is a perspective view of a partial port conductor removed from a circuit arrangement in a half-bridge topology according to FIG. 1 as shown from perspective B-B.

Additionally referring now to FIGS. 2 and 3, wherein FIG. 2 depicts a representative cross-sectional view of the assembly taken along line II in FIG. 1, and FIG. 3 represents a partial view of a DC port conductor 20B construction from view-point B-B in FIG. 1, and wherein the DCB substrate consists not only of ceramic substrate 10 and circuit-friendly ribbon connectors 12 arranged on its top surface, but also of a usually-shaped holohedral metal lamination 11 on the underside of ceramic substrate 10, applied by the same method, in the same thickness and made of the same metal as the ribbon connectors 12. On the top surface of substrate 10, opposite metal lamination 11, power semiconductor components 13 are soldered to respective circuit-friendly ribbon connectors 12.

A narrow longitudinal side of the DC port conductors 20, (as shown 20b, but additionally 20a) is arranged to face substrate 10 and provided therebetween with additional surface elements 21. Surface elements 21 are designed such that wire bond connections can be provided which extend from the surface elements 21 to respective power semiconductor components 13 and/or to ribbon connectors 12 as required by a manufacturer. As noted above, the two DC port conductors 20a, 20b are arranged in close proximity (as shown substantially parallel) to each other and are electrically insulated and separated only by insulation foil member 25.

In a manner analogous to the DC port conductors 20, AC port conductor 30 is also provided with respective surface elements 31 similarly enabling simple, quick, low loss and low ohmic resistance connection between respective AC port conductor 30, through wire bond connections 41 which are in the form shown and serve as an electrical connection, to a respective connector ribbon 12 (shown). It should be additionally understood that in an alternate embodiment, surface elements 31, may additionally or alternatively provide suitable electrical connection with semiconductor components 13 (not shown).

All port conductors 20,30 are arranged in close proximity to substrate 10 and/or respective ribbon connectors 12 depending on the design of the power semiconductor module. In other words, depending on the placement of a ribbon connector 12 on the top surface of the substrate, the port conductor 20, 30 may run proximate to or over either or both the ribbon connector and the substrate, as shown along their entire length.

It should also be noted that a substantial length portion (preferably at least about 50% of the total length, and more preferably at least 75%, and even more preferably still 90%) of each DC port conductor (20a, 20b) runs parallel to (but does not touch) a similar substantial length portion on the other DC port conductor (20a, 20b), even were portions of the length of each DC port conductor are at angles to each other, as will be shown later. In this manner, both DC port conductors 20 may generally run in close proximity and still provide a compact circuit design with low loss and low parasitic inductances.

To separate respective port conductors 20,30 from substrate 10 and/or ribbon connectors 12, the circuit arrangement is provided with spacers 22, 32 respectively and/or base elements 26, as shown. The spacers 22, 32 also serve as an insulation layer between the electrical insulation and, for example, the ribbon connectors 12. These spacers are arranged below the port conductors 20, 30.

For some surface elements 21, 31, in certain types of power semiconductor module designs, and also for all surface elements, it may be advantageous as well to arrange these spacers 22, which serve as an insulation layer, below respective surface elements 21, 31 although this is not required. Base elements 22, 32 may take any form required by a manufacture to ensure effective operation of the power semiconductor module and prevent unintended conduction and induction of electrical current.

Base elements 26 project from and a part of port conductors 20, 30 (as shown) and establish a contact with substrate 10. They are part of the port conductor 20, 30 (where used) and are arranged under or beside (or both) the surface elements 21, 31. Base elements 26, just as the spacers 22, 32, serve the purpose of preventing the port conductors 20, 30 from oscillating when the wire bond connection is established.

It should be noted in the present inventive circuit arrangement, that port conductors 20, 30, just as the other port conductors, consists of a flat metallic body preferably made of copper with a treated, for example silver-plated, surface. This metallic body carries surface elements 21, 31 made, for example, by means of a stamping or a bending technique, as well as base elements 26.

The surface elements 21, 31 serve the purpose of electrically contacting the ribbon connectors 12 and/or the semiconductor elements 13 by means of wire bond connections 40, 41 as shown. The base elements 26 serve the purpose of supporting the port conductors 20, 30 on a part of the substrate 10 that is not provided with a ribbon connector 12.

As noted above, while it should be understood, that a port conductor 20, 30 may be provided with one or more recesses 23, to allow wire bond connections extending at an angle (right shown, but others allowable) to the port conductor (see for example No. 42 in FIG. 1).

It is important to additionally understand, that one or more recesses 23 may additionally serve the purpose of allowing selected surface elements 21 of an adjacently arranged port conductor 20 (20a, 20b) to extend through the port conductor 20 that is provided with the recesses (for example see No. 23 in FIGS. 4 and 5, as will be explained).

Below the port conductor 20 30, a spacer 22 is provided for the electrical insulation and/or as an interspace (shown in FIG. 2 under port conductor 30) to the substrate 10 and/or the ribbon connectors 12, acting analogous to the base element A selected insulating spacer 22a may extend as far as below a selected surface elements 21, 31 as required by a design.

Additionally referring now to FIG. 4, another embodiment of the present inventive circuit shown is arranged in a half-bridge topology. Two DC port conductors (20a, 20b) are again in close proximity to each other over their entire length. Here, DC port conductor 20a is a minus port conductor and DC port conductor 20b is a positive port conductor as shown.

In two places, the minus DC port conductor 20a is provided with recesses 23 through which surface elements 21 of the plus DC port conductor 20b extend. Thus, the two DC port conductors 20a, 20b, arranged along a longitudinal side of the half-bridge are provided with wire bond connectors 40, 41 for contacting the ribbon connectors 12 or the power semiconductor components 13.

The half-bridge itself consists of two power switches each formed by 3 IGBTs respectively 13a. Each power switch is assigned a power diode 13b that is wired antiparallel to the same, as shown. The collectors arranged on the underside of the IGBTs assigned to the first semiconductor switch are connected to the plus DC port conductor 20b or its respective surface elements 21 whereby wire bond connections 41 are arranged between these surface elements 21 and the ribbon connectors 12 assigned to said IGBTs.

In the same manner, the cathode of the antiparallel-wired diode 13b is connected to the plus DC port conductor 20b. Some of the emitters of these IGBTs are connected to each other by means of wire bond connections 44 and directly to the AC port conductor 30 by means of wire bond connections 40. The anode of the power diode 13b is also connected via wire bond connections 44 to an emitter of an IGBT and via the wire bond connection 40 of the latter to the AC port conductor 30.

The collectors of the IGBTs 13a of the second power switch of the half-bridge are connected to the AC port conductor 30 via wire bond connections 41 to the ribbon connectors 12 on which the IGBTs are arranged. Analogous to this, the cathode of the antiparallel-wired power diode 13b is connected to the AC port conductor 30. The emitters of the IGBTs 13a and the anode of the power diode 13b are directly connected via wire bond connections 40, 44 to the minus DC port conductor 20a.

Figure 5:
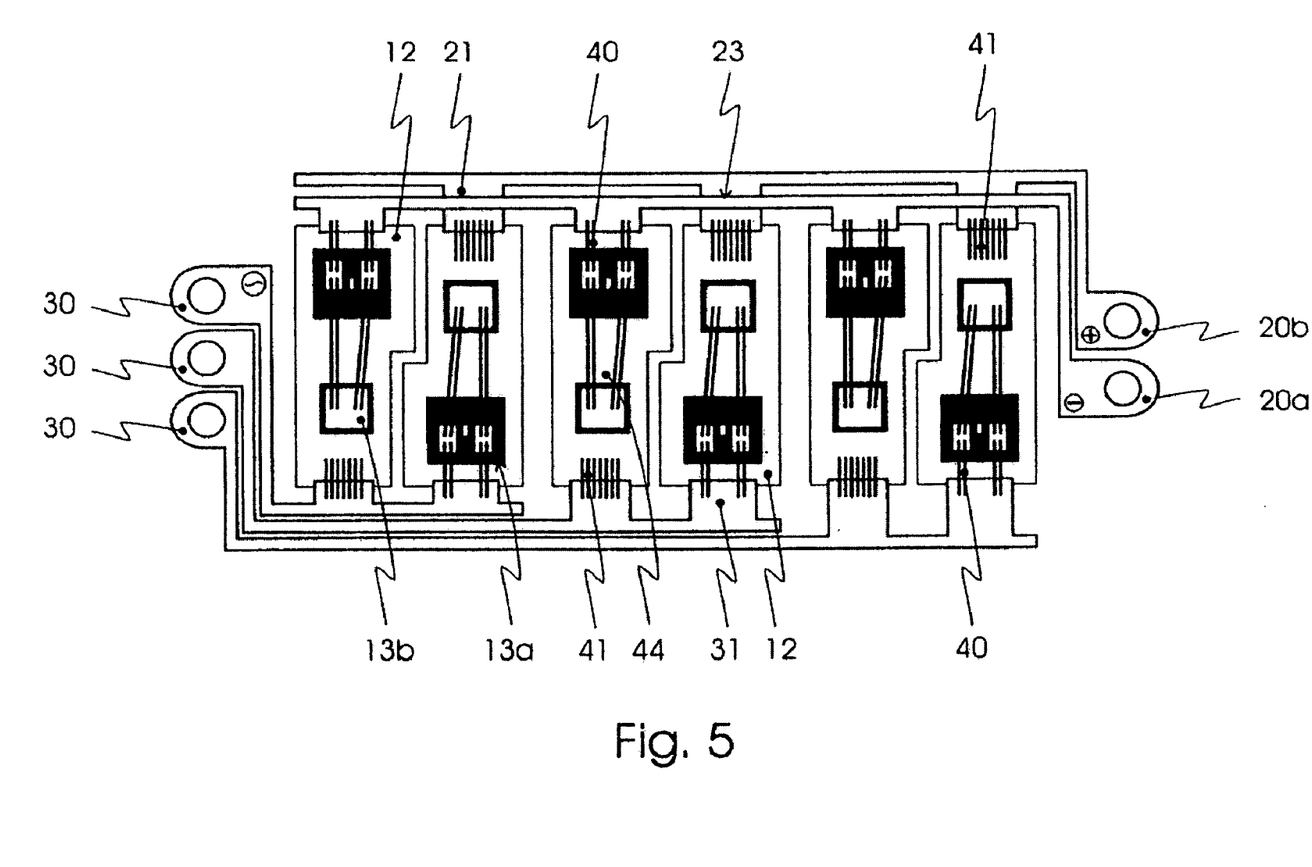
FIG. 5 is a schematic top view of an inventive circuit arrangement according to an alternative construction of the present invention.

Additionally referring now to FIG. 5, another embodiment of the present invention shows a circuit arrangement in three-phase converter topology. In principle, this is an alignment of three half-bridges (as shown in FIG. 4), but for the sake of simplification each power switch is represented by only one IGBT 13a. The DC ports 20 are designed analogue to those shown in FIG. 4, also with respective and multiple recesses 23 of the minus DC port conductor 20a to allow surface elements 21 of the plus DC port conductor 20b to extend through to achieve the circuit-friendly connections described earlier. The three necessary AC port conductors 30 are arranged on the side of the circuit arrangement opposite the DC port conductors 20 (20a, 20b), and each of these are contacted in the same manner as described under FIG. 4.

As should be understood after reviewing the above detailed description, the provided circuit arrangement, consisting of at least one electrically insulating substrate with applied mutually insulated metallic ribbon connectors, with power semiconductor components on said ribbon connectors, at least two DC port conductors (terminal conductors etc.) and at least one AC port conductor (terminal conductors etc.), has at least the following resultant inventive characteristics:

The DC port conductors are designed as strips, with two (of opposite polarity) placed in close proximity to each other and/or separated from each other only by an electrical insulation or by a space. This results on the one hand in compact dimensions in the area of the port conductors, and on the other hand in a low-inductance design of said port conductors. Advantageously, the port conductors are provided with contact elements such as screw connectors, for external contacting.

The DC port conductors are in at least a substantial partial sector arranged parallel and advantageously in close proximity to the substrate surface and/or the ribbon connectors applied thereto as well as electrically insulated from the ribbon connectors.

Advantageously, the at least one AC port conductor is also arranged in at least one partial sector in close proximity to the substrate surface and/or the ribbon connectors applied thereto and electrically insulated from said ribbon connectors.

At least one port conductor is provided with a surface element which is arranged parallel to the substrate surface. The at least one surface element in turn is provided with at least one power semiconductor component and/or at least one connector ribbon.

Similarly as an advantage, the connections are wire bond connections. It is furthermore advantageous that when under or in close proximity to the surface element, one or more base elements are provided to support the port conductor on the substrate and/or on a connector ribbon.

Another advantage of the inventive embodiment of the circuit arrangement —in addition to the low parasitic inductances and the compact dimensions facilitated by the arrangement—is the low ohmic resistance of the input leads to the semiconductor components, since the current substantially flows inside the port conductors and has only a relatively short path within the ribbon connectors which in prior art have a higher ohmic resistance.

It should be understood by those skilled in the art, having read the entire disclosure and being aware of the state of the art, that as noted elsewhere in the description above, the phrase port conductors may be alternatively understood within the context of the art as a connecting conductor, a hook-up conductor, a terminal-type conductor or leadless chip-type carrier or conductor within the design and inventions as shown herein without confusion to those skilled in the art.

It should additionally, and similarly, be understood by those skilled in the art that as used herein above that the phrase current-circumfused should be understood as meaning current surrounded or wherein current flows relative to the element discussed.

Additionally, it should be understood from the complete disclosure herein that positioning the DC and AC port conductors proximate the ribbon conductor may alternatively mean (as shown) positioned extending over, but insulated and separated by a space or an insulator; positioned on, but insulated and separated by a physical spacer or insulator, or passing over a gap between two adjacent ribbon connectors, etc. So long as there is no electrical conduction or induction between the port conductors and the ribbon connectors, the position is a proximate position where necessitated by circuit design.

Consequently, the present invention provides substantial commercial, assembly, manufacturing, and electrical loss and induction benefits to the industry in a simplified package for use alone or in electrical devices requiring such circuitry and power semiconductor modules.

Although only a single or few exemplary embodiments of this invention have been described in detail above, those skilled in the art will readily appreciate that many modifications are possible in the exemplary embodiment(s) without materially departing from the novel teachings and advantages of this invention. Accordingly, all such modifications are intended to be included within the spirit and scope of this invention as defined in the following claims.

In the claims, means- or step-plus-function clauses are intended to cover the structures described or suggested herein as performing the recited function and not only structural equivalents but also equivalent structures. Thus, for example, although a nail, a screw, and a bolt may not be structural equivalents in that a nail relies on friction between a wooden part and a cylindrical surface, a screw's helical surface positively engages the wooden part, and a bolt's head and nut compress opposite sides of a wooden part, in the environment of fastening wooden parts, a nail, a screw, and a bolt may be readily understood by those skilled in the art as equivalent structures.

As noted above, having described at least one of the preferred embodiments of the present invention with reference to the accompanying drawings, it is to be understood that the invention is not limited to those precise embodiments, and that various changes, modifications, and adaptations may be affected therein by one skilled in the art without departing from the scope or spirit of the invention as defined in the appended claims.

What is claimed is:

1. A circuit arrangement, for power semiconductor modules, comprising:
    at least one electrically insulating substrate;
    at least two mutually insulated ribbon connectors on said substrate;
    at least one power semiconductor component attached to at least one of said ribbon connectors;
    at least a first and a second DC port conductors and at least one AC port conductor;
    said DC port conductors being arranged proximate to each other and at least one of said substrate and said ribbon conductors;
    each said DC port conductor including at least a first substantial length portion in parallel to a second respective substantial length portion on said second DC port conductor;
    said AC port conductor having at least one portion proximate at least one of said substrate surface and said ribbon connectors;
    at least one surface element extending at least at a first angle from one of said AC port conductor and said DC port conductors; and
    at least one electrical connection extending from said at least one surface element to at least one of said power semiconductor component and said at least one ribbon conductor, whereby said circuit arrangement provides a low parasitic inductance and a low ohmic resistance in a power semiconductor module.

2. A circuit arrangement, according to claim 1, wherein:
    said first angle is a ninety degree angle, whereby said at least one surface element extends substantially parallel to said substrate.

3. A circuit arrangement, according to claim 1, wherein:
each said DC port conductor is arranged proximate said ribbon conductors;
said DC port conductors and said at least one surface element being electrically insulated from said ribbon conductors, whereby no direct electrical link exists between said DC port conductors and said ribbon conductor;
said AC port conductors are arranged proximate said ribbon conductor; and
said AC port conductors being electrically insulated from said ribbon conductors, whereby no direct electrical link exists between said AC port conductors and said ribbon conductor.

4. A circuit arrangement, according to claim 1, further comprising:
projecting end portions on each respective said DC and AC port conductors extending away from said substrate; and
each respective projecting portion including at least one respective contact element for securing external electrical contacting of said power semiconductor module to said port conductor.

5. A circuit arrangement according to claim 4, further comprising:
a housing bounding said power semiconductor module and said circuit;
said housing enclosing said at least one substrate and mechanically supporting respective said DC and AC port conductors;
said housing including at least two spaced apart recesses; and
said projecting end portions extending through said spaced apart recesses enabling simple electrical connection thereto while said housing provides electrical protection to said circuit.

6. A circuit arrangement according to claim 1, wherein:
said at least one electrical connection is a wire bond connection, whereby said wire bond connection and said at least one surface element enable simple electrical connection during an assembly of said circuit while maintaining low parasitic induction of said circuit.

7. A circuit arrangement according to claim 1, further comprising:
at least one sensor component on at least one of said substrate and said at least one ribbon connector.

8. A circuit arrangement according to claim 1, further comprising:
at least one recess defined in at least one of said DC and said AC port conductors; and
said at least one recess is on a side of said at least one port conductor facing said at least one substrate, whereby a base of said recess is further from said substrate than a bottom surface of said at least one port conductor.

9. A circuit arrangement according to claim 1, further comprising:
at least one electrical insulation layer; and
said at least one insulation layer extending between at least a portion of one of said DC port conductors and at least one of said at least two ribbon connectors.

10. A circuit arrangement according to claim 9, further comprising:
an extension layer of said electrical insulating layer extending between said at least one surface element and one of said ribbon connector and said substrate.

11. A circuit arrangement according to claim 1, further comprising:
at least one base element extending from a bottom surface of at least one of said DC and said AC port conductors; and
said at least one base element supporting said at least one port conductor on said at least one substrate.

12. A circuit arrangement, according to claim 1, further comprising:
at least one metal lamination on said substrate opposite on an opposite side of said substrate from said at least one ribbon connector.

13. A circuit arrangement, according to claim 1, further comprising:
at least one electrical insulation layer;
said at least one insulation layer extending between at least a portion of one of said DC port conductor and said at least one ribbon connector;
an extension layer of said electrical insulating layer extending between said at least one surface element and one of said ribbon connector and said substrate;
at least one base element extending from a bottom surface of at least one of said DC and said AC port conductors; and
said at least one base element supporting said at least one port conductor on said at least one substrate.

14. A circuit arrangement, for power semiconductor modules, comprising:
at least one electrically insulating substrate;
at least two mutually insulated ribbon connectors on said substrate;
at least one power semiconductor component attached to at least one of said ribbon connectors;
at least a first and a second DC port conductors and at least one AC port conductor;
said DC port conductors being arranged proximate to each other and at least one of said substrate and said ribbon conductors;
each said DC port conductor including at least a first substantial length portion in parallel to a second respective substantial length portion on said second DC port conductor;
said AC port conductor having at least one portion proximate at least one of said substrate surface and said ribbon connectors;
at least one surface element extending at least at a first angle from one of said AC port conductor and said DC port conductors;
at least one electrical connection extending from said at least one surface element to at least one of said power semiconductor component and said at least one ribbon conductor;
at least one electrical insulation layer; and
said at least one insulation layer extending between at least a portion of one of said DC port conductor and said at least one ribbon connector, whereby said circuit arrangement provides a low parasitic inductance and a low ohmic resistance in a power semiconductor module.

15. A circuit arrangement according to claim 14, further comprising:
an extension layer of said electrical insulating layer extending between said at least one surface element and one of said ribbon connector and said substrate.

16. A circuit arrangement according to claim 15, further comprising:
at least one base element extending from a bottom surface of at least one of said DC and said AC port conductors; and
said at least one base element supporting said at least one port conductor on said at least one substrate.

17. An electrical device, comprising:
a power semiconductor module;
said power semiconductor module including a circuit arrangement comprising:
at least one electrically insulating substrate;
at least two mutually insulated ribbon connectors on said substrate;
at least one power semiconductor component attached to at least one of said ribbon connectors;
at least a first and a second DC port conductors and at least one AC port conductor;
said DC port conductors being arranged proximate to each other and at least one of said substrate and said ribbon conductors;
each said DC port conductor including at least a first substantial length portion in parallel to a second respective substantial length portion on said second DC port conductor;
said AC port conductor having at least one portion proximate at least one of said substrate surface and said ribbon connectors;
at least one surface element extending at least at a first angle from one of said AC port conductor and said DC port conductors;
at least one electrical connection extending from said at least one surface element to at least one of said power semiconductor component and said at least one ribbon conductor;
at least one electrical insulation layer; and
said at least one insulation layer extending between at least a portion of one of said DC port conductor and said at least one ribbon connector, whereby said circuit arrangement provides a low parasitic inductance and a low ohmic resistance in a power semiconductor module.

18. A circuit arrangement according to claim 17, further comprising:
an extension layer of said electrical insulating layer extending between said at least one surface element and one of said ribbon connector and said substrate.

19. A circuit arrangement according to claim 18, further comprising:
at least one base element extending from a bottom surface of at least one of said DC and said AC port conductors; and
said at least one base element supporting said at least one port conductor on said at least one substrate.

20. A circuit arrangement, with low inductances and low ohmic resistance in the current inputs and outputs in a power semiconductor modules, comprising:
at least one electrically insulating substrate;
a plurality of mutually insulated metallic ribbon connectors applied to said substrate;
at least one power semiconductor component attached to at least one of respective said ribbon connectors;
at least a first and a second DC port conductors and at least one AC port conductor;
said DC port conductors being arranged proximate to each other and at least one of said substrate and said ribbon conductors;
each said DC port conductor including at least a substantial length portion in parallel to a second respective substantial length portion on said second DC port conductor;
at least one AC port conductor having at least one portion in close proximity to one of said substrate surface and said ribbon connectors;
at least one of said DC port conductors and said AC port conductor include at least one surface element;
said at least one surface element extending substantially parallel to a surface of said substrate; and
at least one electrical connection extending from said at least one surface element to at least one of said power semiconductor component and said at least one ribbon conductor, whereby said circuit arrangement provides a low parasitic inductance in a power semiconductor module.

21. A circuit arrangement, according to claim 20, wherein:
said DC port conductors are arranged proximate said ribbon conductors;
said DC port conductors being electrically insulated from said ribbon conductors, whereby no direct electrical link exists between said DC port conductors and said ribbon conductor;
said AC port conductors are arranged proximate said ribbon conductor; and
said AC port conductors being electrically insulated from said ribbon conductors, whereby no direct electrical link exists between said AC port conductors and said ribbon conductor.

22. A circuit arrangement according to claim 20, wherein:
said power semiconductor module is provided with a housing that encloses said at least
one substrate and supports respective said DC and AC port conductors mechanically;
said housing including at least two spaced apart recesses;
extending portions of respective said DC and AC port conductors extending through said recesses away from said housing; and
each respective said extending portion including a respective contact element for securing external electrical contacting of said power semiconductor module.

23. A circuit arrangement according to claim 20, wherein:
said at least one electrical connection is a wire bond connection.

24. A circuit arrangement according to claim 20, further comprising:
at least one sensor component arranged on at least one of said substrate and said at least one ribbon connector.

25. A circuit arrangement according to claim 20, wherein:
at least one of said DC and said AC port conductors includes at least one recess; and
said at least one recess is on a side of said at least one port conductor facing said at least one substrate.

26. A circuit arrangement according to claim 20, further comprising:
an electrical insulation layer between at least a portion of at least one of said at least two DC port conductors and said at least one ribbon connector.

27. A circuit arrangement according to claim 26, wherein:
said electrical insulating layer extends below said at least one surface element.

28. A circuit arrangement according to claim 20, wherein:
at least one base element is on at least one of said DC and said AC port conductors, whereby said at least one base element supports said at least one port conductor relative to said at least one substrate.

* * * * *